(12) United States Patent
Samuelson et al.

(10) Patent No.: US 10,579,746 B2
(45) Date of Patent: Mar. 3, 2020

(54) METHOD AND APPARATUS FOR APPLYING AN ARCHITECTURAL LAYOUT TO A BUILDING CONSTRUCTION SURFACE

(71) Applicant: JZ Technologies, LLC, Cincinnati, OH (US)

(72) Inventors: Jeffrey Samuelson, Cincinnati, OH (US); Joshua W. Buck, Dayton, OH (US)

(73) Assignee: JZ Technologies, LLC, Cincinnati, OH (US)

( * ) Notice: Subject to any disclaimer, the term of this patent is extended or adjusted under 35 U.S.C. 154(b) by 0 days.

(21) Appl. No.: 15/472,057

(22) Filed: Mar. 28, 2017

(65) Prior Publication Data

US 2017/0280114 A1    Sep. 28, 2017

Related U.S. Application Data

(60) Provisional application No. 62/313,969, filed on Mar. 28, 2016.

(51) Int. Cl.
| | |
|---|---|
| G06F 17/00 | (2019.01) |
| G06F 17/50 | (2006.01) |
| G06T 3/00 | (2006.01) |
| H04N 9/31 | (2006.01) |
| G01C 15/00 | (2006.01) |
| G01S 17/89 | (2020.01) |

(52) U.S. Cl.
CPC ....... *G06F 17/5004* (2013.01); *G01C 15/002* (2013.01); *G06T 3/0068* (2013.01); *H04N 9/3161* (2013.01); *H04N 9/3185* (2013.01); *G01S 17/89* (2013.01)

(58) Field of Classification Search
CPC ... G06F 17/5004; G01S 17/89; G06T 3/0068; H04N 9/3161; H04N 9/3185
USPC ................................ 345/418, 619, 632, 633
See application file for complete search history.

(56) References Cited

U.S. PATENT DOCUMENTS 6,920,242 B1 * 7/2005 Moore ................. G06K 9/6211
382/154
8,756,085 B1 * 6/2014 Plummer ............... G06Q 40/00
705/4

(Continued)

OTHER PUBLICATIONS

Holz, Dirk, et al. "Registration with the point cloud library: A modular framework for aligning in 3-D." IEEE Robotics & Automation Magazine 22.4 (2015): 110-124.*

(Continued)

*Primary Examiner* — Sarah Lhymn
(74) *Attorney, Agent, or Firm* — Taft Stettinius & Hollister LLP (57) ABSTRACT

The present device may project a building design drawing onto a floor to indicate substantially precisely where contractors should install their products on the construction site. The device scans the raw space, compares the proposed construction documents with the existing conditions and projects a full scale accurate image of the plan on a work surface of either gravel, dirt and/or concrete. The resulting image would allow installation of underground utilities and walls more quickly and with increased accuracy. This decreases the time needed for installation and reduces or eliminates the need for costly re-work necessitated by these common errors.

8 Claims, 5 Drawing Sheets

(56) References Cited

U.S. PATENT DOCUMENTS

| | | | | |
|---|---|---|---|---|
| 2004/0036845 A1* | 2/2004 | Hoffmeister | ........... | G03B 21/28 |
| | | | | 353/79 |
| 2013/0096873 A1* | 4/2013 | Rosengaus | ........... | G01C 15/002 |
| | | | | 702/151 |
| 2013/0155058 A1* | 6/2013 | Golparvar-Fard | .... | G06T 19/006 |
| | | | | 345/419 |
| 2014/0268064 A1* | 9/2014 | Kahle | .................... | G01B 11/14 |
| | | | | 353/28 |
| 2015/0092178 A1* | 4/2015 | Debrunner | .............. | G01S 17/89 |
| | | | | 356/4.01 |
| 2016/0379366 A1* | 12/2016 | Shah | ........................ | G06T 7/38 |
| | | | | 345/419 |
| 2017/0097227 A1* | 4/2017 | Sanders | ................ | G01C 11/02 |

OTHER PUBLICATIONS

Chen, Jia, et al. "3D shape modeling using a self-developed hand-held 3D laser scanner and an efficient HT-ICP point cloud registration algorithm." Optics & Laser Technology 45 (2013): 414-423.*

Shi, Q., Xi, N., Chen, Y., & Sheng, W. (Oct. 2006). Registration of point clouds for 3D shape inspection. In 2006 IEEE/RSJ International Conference on Intelligent Robots and Systems (pp. 235-240). IEEE.*

* cited by examiner

METHOD AND APPARATUS FOR APPLYING AN ARCHITECTURAL LAYOUT TO A BUILDING CONSTRUCTION SURFACE

RELATED APPLICATION

The present non-provisional application is based upon and claims the priority of U.S. Provisional Application No. 62/313,969 filed Mar. 28, 2016.

BACKGROUND

The present invention relates to mixed reality apparatus and methods and more particularly to those used in the context of new construction sites.

Laser scanners which produce 3D representations in the form of point clouds are commonly known as laser radar, or LIDAR. Image processing software is commonly used to derive a 3D overlay image which can be projected over the scanned area using a commonly available 2D projector. This concept is often used in mixed reality contexts, where information is overlaid on top of real world objects.

During a typical building construction process, contractors are brought in to integrate plumbing and electrical infrastructure, wall framing and the like. On small construction projects, layout is typically controlled by the first trade on the job site. At this early stage, the building is little more than a cold dark shell on grade. The reference points by which plumbing or electrical conduit may be laid out are limited. In the past, layout was typically accomplished on such projects using strings and tape measures. Measurements were taken from one or more existing reference points, such as a foundation wall or support, to make these determinations. Chalk lines would be placed on the concrete slab or foundation. Lasers were only used for leveling and plumbing walls. Due to these limitations, the industry has accepted that laying out below slab utilities is not a perfect science. Time and money were built into proposals to correct errors in the field. There were time delays to make corrections, all leading to frustration for the general contractor and owner.

SUMMARY OF THE INVENTION

The present invention contemplates a portable imaging apparatus capable of surveying the building area under construction and laying out an architectural plan on the floor surface through the use of lasers, projectors and sensors. In one embodiment, the process might include the steps of transferring an electronic embodiment of the architectural plan to the imaging (process/scan/project) apparatus; installing the imaging apparatus at a selected height on a fixed element within the building boundaries; locating previously erected building structures (existing conditions); verifying the scale; calibrating; generating a scanned image; overlaying, superimposing or comparing the architectural plan and the scanned image of existing conditions; adjusting the plan to fit exactly with the scanned image (make exact overlay); creating a projected image from the adjusted plan; projecting the image onto a base horizontal building surface; adjusting brightness, clarity, and sharpness; fine tuning the projected image using a hand held controller (verify scale/adjust image to conform with actual space); and locking the image into place.

DETAILED DISCLOSURE OF AN ILLUSTRATIVE EMBODIMENT

The present device may project a building design drawing onto a floor to indicate substantially precisely where contractors should install their products on the construction site. The device scans the raw space, compares the proposed construction documents with the existing conditions and projects a full scale accurate image of the plan on a work surface of either gravel, dirt and/or concrete. The resulting image would allow installation of underground utilities and walls more quickly and with increased accuracy. This decreases the time needed for installation and reduces or eliminates the need for costly re-work necessitated by these common errors.

Figure 5:
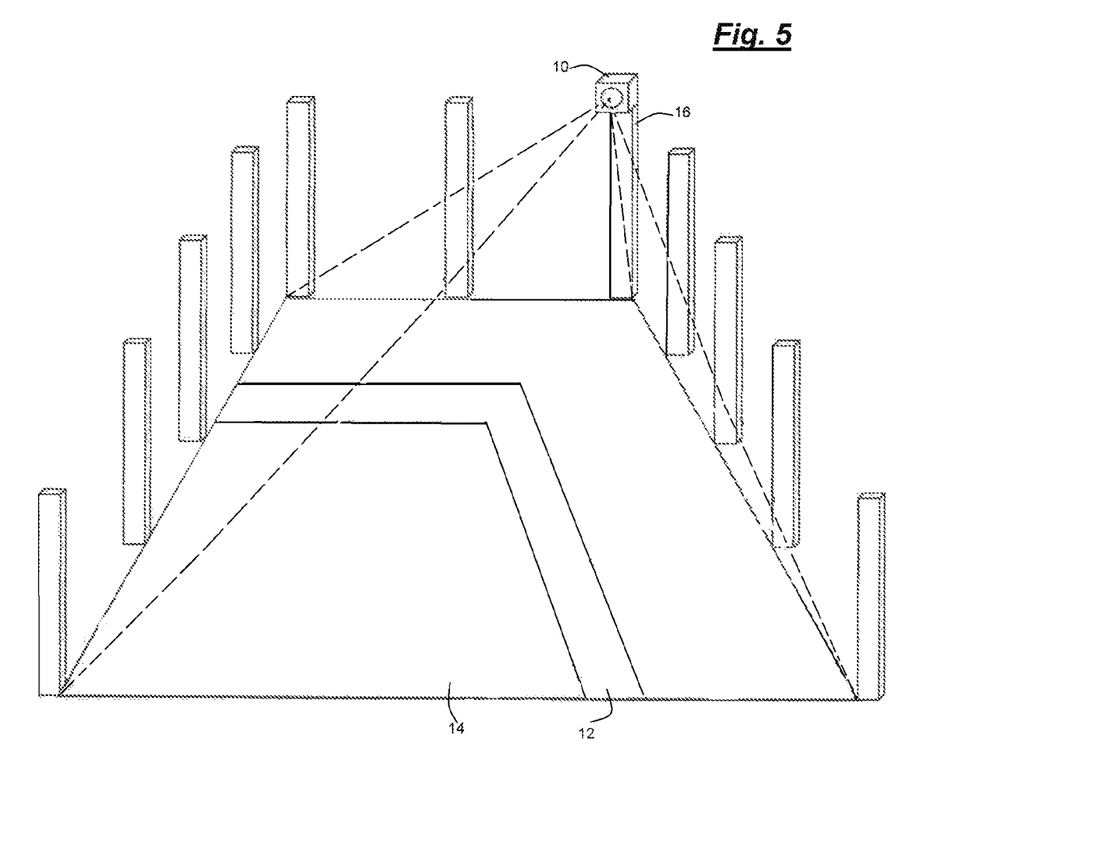
FIG. 5 is a depiction of deployment of device in a new construction context.

With reference to FIG. 5, modest experience and time would be required to get a CAD Model drawing 12 to show on the floor 14, properly scaled to life size. The operator would extract the device 10 from a protective transporting case and attach it to the top of a wall, or the side of a beam or truss 16. When properly positioned and powered up, the device would scan the room and project the CAD model drawing onto the floor.

Figure 2:
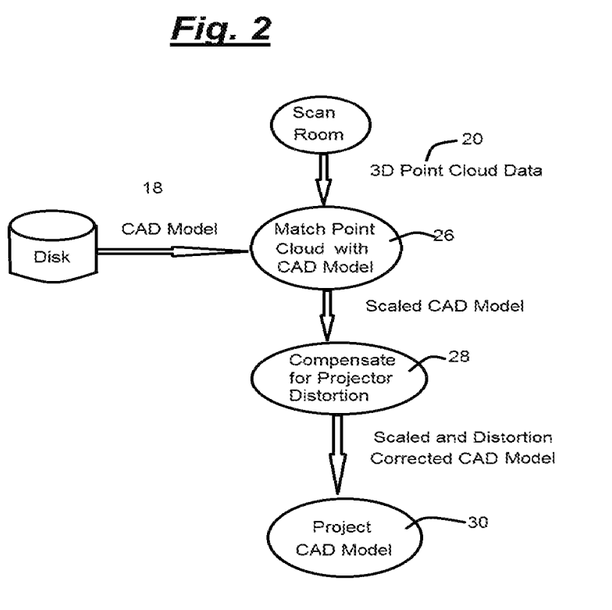
FIG. 2 is a flowchart of the software.

Technicians could provide live assistance remotely via a wireless connection to the device. They could assist the operator with any issues they encounter or provide consulting advice for how to best employ it. As shown in FIG. 2, they could also transfer CAD Model drawings 18 to the device as needed by the contractors. A 3D Point Cloud 20 of the room could be scanned and viewed by the Technician to gain awareness of the situation they were supporting.

Experts could track device location, usage and its operating condition.

The design could be modular to enable upgrading of individual hardware modules as technology improves over time or to simply offer additional options. This would for example, permit the exchange of a Wi-Fi wireless connection module with a cellular connection module.

As the software accuracy, precision and features are improved, new updates could be installed remotely to allow frequent and easy improvements to the device.

To aid the contractor in properly positioning a sewage line trench, for instance, the device would highlight areas 14 (FIG. 5) where the trench should be dug.

The device would provide the operator with substantially exact measurements of the distances between selected objects.

The device would be able to take a snapshot of the area and transmit it to others to provide a progress update or to highlight an issue that needed to be addressed.

Key features of the device are the ability to survey and layout through the use of lasers, laser surveying, photo-surveying and sensors, affordability and portability.

Preferably the device would be attached to a truss 16 (FIG. 5) as high as possible above the target area. A CAD Model 18 (FIG. 2) of the building could be transmitted wirelessly to the device or inserted via an SD card or other portable data storage element. The device could have a delay once powered up to allow the operator to vacate the room before the scanning operation began. Once a satisfactory scan 20 of the room had been made, the software would match the generated Point Cloud data to the CAD Model of the same room 26. The CAD Model view could be transformed to compensate for projector distortion 28 and then sent to the projector for viewing 30

The present process may be described as follows. The desired architectural plan is downloaded into the device. The plan may be embodied in Autocad or AutoDesk. For example, Revit is a single application that includes features for architectural design, MEP, structural engineering, and construction. Revit features about the suite. parametric components and uses intelligent building components to improve design accuracy. Another example is BIM, an acronym for Building Information Modeling, or Building Information Model. It describes the process of designing a building collaboratively using one coherent system of computer models rather than as separate sets of drawings. Next, the device could be installed on a fixed structure, such as by using quick release clamps. The device would then be powered up to scan the room and existing conditions. Sensors and scanners incorporated in the device could locate fixed items such as structure and perimeter concrete. The information obtained would be communicated to the hand held controller and/or a remote monitor. The device would analyze existing conditions through the use of scanners and sensors. Through the controller, the operator would be able to verify the scale using the 3D laser settings. Dimensions could be checked while scanning a common tape measure. An overlay of the architectural plan would then be applied onto the scanned existing conditions and the scanned image could be superimposed on the architectural overly. The scanned image could then be compared with the proposed architectural image. Next the projection image would be created from the corrected overlay and existing conditions overlay. A new image for projection could be prepared. The architectural image would then be projected onto the horizontal floor or other surface and the brightness, clarity and sharpness of the image could be adjusted. Minor corrections could be made using the smartphone/controller app to adjust to exact conditions. Feedback would be used to finalize the image and to prepare for final image projection. The scale of image could be verified with the actual space, and the image locked into place with smartphone/controller app. The image would be projected onto the grade surface, and excavation for in ground utilities could then proceed.

Figure 1:
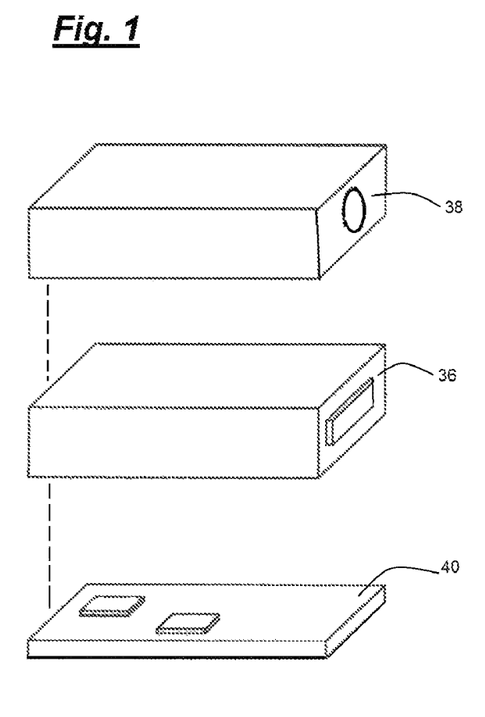
FIG. 1 is a diagram of some of the internal modules of the device.
Figure 3:
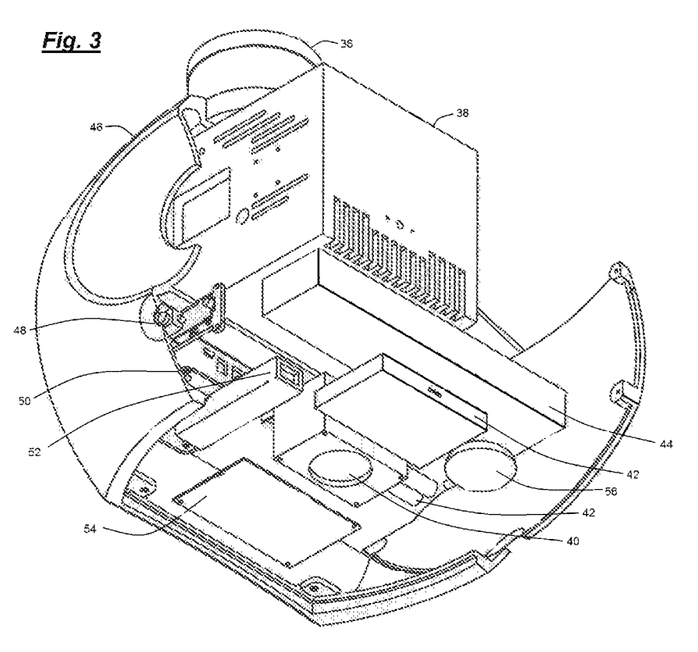
FIG. 3 is a perspective view of the device with portion of its protective case removed.
Figure 4:
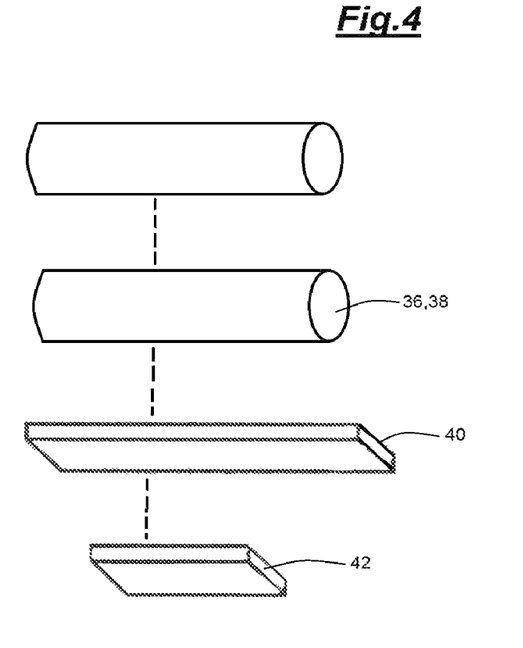
FIG. 4 is a diagram of some of the modules within the device.

As illustrated in FIGS. 1, 3, and 4, the present scanner-projector and auxiliary apparatus could consist of: a 3D laser scanner 36, a laser projector 38, a computer 40, a mechanism or linking device by which to connect to a wireless network 42, such as a receiver or transceiver, one or more clamps for attaching the device to a beam, a portable power supply 44, computer vision software for 2D/3D data processing, human-interaction software, a device enclosure and protective transporting case 46.

The device may include a 3D laser LIDAR scanner; a laser projector; an onboard computer, cellular, Wi-Fi, Bluetooth and GPS receivers; live camera 48; and 3D printed case 46.

Additional components could be the following. OGS is an accurate and cost-effective field information collection method that obtains data by using Global Positioning System (GPS) technology for establishing the horizontal and vertical positions of various items in the field. GPS is excellent for projects where few obstacles to the satellite constellation hinders the receipt of the GPS signal. The system lends itself to high tolerance work to define the location of remote points and for the use in collecting a large amount of data on a large open site. Data can be gathered without the need for indivisibility between control points. Production on most projects can increase 200 to 300% over conventional methods providing for a cost-effective, timely completion of your project. Laser surveys, such as 3D laser survey available from Faro Corporation, are capable of scanning complex, hard-to-reach or dangerous environments safely and accurately. Live photo, camera and lenses may also be included in the device. A laser projector consists of a housing that contains lasers, mirrors, galvanometer scanners, and other optical components. It can contain one laser light source for single-color projection or three sources for RGB (red. green, and blue) full color projection.

The distance that light must travel from the projector to the projection surface is known as the image path. When the image path is the same all along the outer edges of a projected image, the projected image should be rectangular. However, when one attempts to project an image onto a surface at an angle, there is distortion in image dimensions, making a rectangle appear as a trapezoid due to the image path changing at opposite ends of the projected image. In other words, a projected image will appear as a trapezoid when the distance from the projector to the top of the projected image is different than the distance from the projector to the bottom of the projected image. This will also occur when the distances from the projector to the left and right of the projected image are different. In order to correct for this keystone distortion, an algorithm know as a perspective transformation is employed to project accurate drawings in the distorted image plane.

Advances in 3D scanners enable one to scan a portion of a worksite creating a 3D point cloud of the worksite. One then uses point cloud alignment algorithms to align the scanned point cloud with a CAD generated model containing the worksite measurements. A visual overlay of the CAD point cloud and the point cloud of the worksite will enable an experienced architect to validate worksite measurements. Furthermore, by leveraging advances in laser projection systems, future work can be projected directly onto the worksite so that laborers can see exactly where their work is needed and complete the work in the correct, outlined space.

In order for two point clouds to be aligned, the point clouds must have the same coordinate system. It is often the case that the point clouds have their own unique coordinate systems that are not in units of measure. These coordinate systems are used because of optimizations for the algorithm which increase performance.

Two algorithms for aligning two or more point clouds are Iterative Closest Point (ICP) and Sample Consensus Initial Alignment (SAC-IA). Iterative Closest Point was successfully executed and faster than Sample Consensus Initial Alignment which did not produce acceptable results given the configurations tested.

In the context of a point cloud that is captured by a 3D scanner, the origin is defined as the position and orientation of the scanner at the time that the point cloud was captured. This is very useful because it allows the orientation of the scanner to be present in the point cloud, which allows for perspective transformation, a crucial part of the system process. Similar to the problem of having different coordinate systems, having perspectives that are defined on different axis, or on an axis but at drastically different ranges, inhibits the ability to successfully align two point clouds. Since the alignment algorithm has a maximum correspondence distance, which defines the region around a point where correspondences can be computed, the difference in axes or axis ranges prevents the alignment from working. This is resolved by translating one of the point clouds so that they are within an overlapping range on the same axis. One may choose to translate the CAD generated point cloud because it is affected by a change in perspective (as long as the 2D CAD is aligned to it). It is believed that the transformation matrix generated from the point cloud alignment can be used to transform the 2D floor plan for projection. At that point, the work site plan may be projected onto the work surface.

Projection corner calculation computes the coordinates (in meters) of the projection on the floor of the worksite, relative to the Southwest corner of the worksite, which should be equivalent to the lower left corner of the CAD drawing. Once the corners of the projection region are known, an image can be extracted from the 2D CAD drawings and transformed into an image that is ready to be projected. This process requires the orientation and position of the projector relative to (in the coordinate system of) the system scanner, and the field of view (horizontal and vertical) of the projector. The position of the projector is denoted as [x y z] in meters and the orientation is denoted with \tip" (rotation around X-axis), \tilt" (rotation around Y-axis), and \roll" (rotation around Z-axis), all relative to the projector looking straight down such that the top of the projection is the northern edge of the projection. Using the orientation and position, four unit vectors, which represent the depth edges of the projector frustum, are computed. The projector frustum is the geometric representation of the projection. The corners of the projection are the four points where the four unit vectors intersect the floor of the worksite, typically the Z=C plane, where C is a constant depth (indicating a level floor) that is usually 0 (meters) or a few centimeters below 0 (meters). Using the vertical field of view (vFOV) and the horizontal field of view (hFOV). The four unit vectors are:

|   | 1 | 2 | 3 | 4 |   |
|---|---|---|---|---|---|
| x | ($\alpha$) | ($-\alpha$) | ($-\alpha$) | ($\alpha$) |   |
| y | ($-\beta$) | ($-\beta$) | ($\beta$) | ($\beta$) |   |
| z | (1) | (1) | (1) | (1) | (1) |

Where $\alpha$=tan(0:5×hFOV) and $\beta$=tan(0:5×vFOV). The unit vectors are normalized by dividing each element of each of the unit vectors by the magnitude of the unit vector. The magnitude of a vector is the square root of the sum of the squares of all of the vector elements.

The unit vectors are then rotated based on the orientation of the projector. The orientation is denoted with tip (rotation around X-axis), tilt (rotation around Y-axis), and roll (rotation around Z-axis), all relative to the projector looking straight down such that the top of the projection is the northern edge of the projection. Using tip, tilt, and roll angles, three rotation matrices are computed. The standard rotation matrices are:

$$Rx(\text{tip}) = \begin{matrix} 1 & 0 & 0 \\ 0 & \cos(\text{tip}) & \sin(\text{tip}) \\ 0 & -\sin(\text{tip}) & \cos(\text{tip}) \end{matrix} \quad (2)$$

$$Ry(\text{tilt}) = \begin{matrix} \cos(\text{tilt}) & 0 & \sin(\text{tilt}) \\ 0 & 1 & 0 \\ -\sin(\text{tilt}) & 0 & \cos(\text{tilt}) \end{matrix} \quad (3)$$

$$Rz(\text{roll}) = \begin{matrix} \cos(\text{roll}) & -\sin(\text{roll}) & 0 \\ \sin(\text{roll}) & \cos(\text{roll}) & 0 \\ 0 & 0 & 1 \end{matrix} \quad (4)$$

The rotation matrices are then multiplied to each of the unit vectors. Multiplying a 1 by 3 unit vector by a 3 by 3 rotation matrix produces a rotated 1 by 3 unit vector. The order that the rotation matrices are multiplied to the unit vectors matters. The order for this application is given by the following equation:

$$Er = (Rz \cdot (Ry \cdot (Rx \cdot E))) \quad (5)$$

Where E represents one of the E-vectors and Er is the rotated unit vector.

The projection corners are determined by calculating the intersection of the unit vectors with the plane of projection (in this case, the floor). The formula for calculating the intersection of a vector and a plane is:

$$X = V \cdot t + P \quad (6)$$

Where X is the [x, y, z] projection corner corresponding to unit vector V, t is the length of V between X and P, and P is the [x, y, z] location of the projector. The only unknown variable at this point is t. Assuming the floor is a plane with a constant value on the z-axis, Z, we can solve for t using:

$$t = (Z - Pz)/Vz \quad (7)$$

Where Pz is the z-component of the projector location vector and Vz is the z-component of the unit vector V. The four projection corners (X-vectors) can then be computed.

If there is a need to compute any portions of the projection that are outside of the worksite that is modeling in the provided CAD drawings, it is a simple calculation. One can then project an empty image into places where CAD image data was not provided, such as walls and floor outside of the worksite.

The worksite image process may proceed as follows. Once CAD files are received from the customer, a technician prepares the CAD drawings for the service.

This preparation includes making sure a 2D and 3D CAD model are aligned, uploaded to a server, and assigned to the devices that are assigned to the service. The technician may also determine the approximate locations to place the systems on-site to ensure the service will be adequately fulfilled. The primary purpose of the service is to validate a worksite against CAD drawings and to project the drawing onto critical areas of the actual worksite. A system consisting of lasers for scanning and projecting, a computer for computation, a cellular data connection for network access, and other peripherals, will be setup on-site. The system may be activated remotely, produce data to validate the CAD drawings, project the CAD drawing onto the worksite, and monitor the worksite with a camera.

Next, an installer determines where to mount the system, typically on an overhead support beam. Generally, the system will be mounted as high as possible with the projector at an angle and the scanner possibly aligned with the floor. When powered up, the system will attempt to connect to a server at a technician's office. The server will have already been updated with the information about the system's current service, including the necessary CAD files. The system will first download the most recent CAD files and then notify the office that the system is ready to begin scanning. At the discretion of the office technician, the system will be remotely activated and begin scanning. The office technician may validate alignment, checks that scanned cloud aligns with CAD model, determine that the projection images are the correct regions, and checks that the projection is the right scale. The customer is then in a position to use the projected image to proceed with construction.

The invention claimed is:

1. A portable imaging system for laying out an architectural plan on a worksite surface, comprising:
   a Light Detection and Ranging (LIDAR) device configured to emit a LIDAR beam that scans a worksite to generate LIDAR data that is associated with a distance between the LIDAR device and each end point of the LIDAR beam positioned on the worksite, wherein the LIDAR data is associated with a current state of the worksite and is associated with a plurality of current structures and conditions positioned on the worksite that exist in the current state of the worksite when scanned by the LIDAR beam;
   a projector configured to project a projected image onto the worksite surface that aligns the architectural plan image with a 3D point cloud image so that each current structure and condition of the current state of the worksite as depicted in the projected image is aligned with the architectural plan image that the current state of the worksite is to be constructed and corrects distortion between the 3D point cloud image and the architectural plan image thereby enabling the worksite to be modified based on the projected image; and
   a controller configured to:
      generate the 3D point cloud image of the worksite based on the LIDAR data, wherein the 3D point cloud image depicts the current state of the worksite and the plurality of current structures and conditions on the worksite,
      determine an orientation in rotation around an X-axis, Y-axis, and Z-axis position on the X-axis, Y-axis, and Z-axis of the projector to a coordinate system associated with the LIDAR device and a horizontal field of view and vertical field of view of the projector based on the projector projecting downward and defining a northern edge of the projected image;
      generate a first unit vector, a second unit vector, a third unit vector, and a fourth unit vector based on the horizontal view and the vertical field of view of the projector to generate corresponding depth edges of a geometric representation of the projected image, wherein the first unit vector, the second unit vector, the third unit vector, and the fourth unit vector intersect on a floor of the worksite;
      rotate the first unit vector, the second unit vector, the third unit vector, and the fourth unit vector based on the orientation of the projector projecting downward and defining the northern edge of the projected image;
      determine each projection corner of the projected image based on an intersection of the first unit vector, the second unit vector, the third unit vector, and the fourth unit vector with the floor of the worksite;
      align the architectural plan image with the 3D point cloud image, wherein the architectural plan image is aligned with the 3D point cloud image so that each current structure and condition of the current state of the worksite as depicted by the 3D point cloud image is aligned with the architectural plan image when the 3D point cloud image is overlaid on the architectural plan image,
      correct an overlay of the 3D point cloud image on the architectural plan image to account for the distortion between the 3D point cloud image and the architectural plan image when overlaid, wherein the architectural plan image is aligned on an overlapping range of an axis of the 3D point cloud image to correct the overlay of the 3D point cloud image on the architectural plan image, and
      generate the projected image that is projected onto the worksite surface that aligns each current structure and condition of the current state of the worksite with the architectural plan image and corrects the distortion between the 3D point cloud image and the architectural plan image;
   a wireless computing device configured to adjust the projected image projected onto the worksite surface by adjusting a brightness characteristic, a clarity characteristic, and a sharpness characteristic of the projected image to adjust the projected image to a plurality of actual conditions of the worksite surface.

2. The portable imaging system according to claim 1, and further comprising a power supply.

3. The portable imaging system according to claim 1, and further comprising computer software for image processing.

4. The portable imaging system according to claim 1, and further comprising a protective case.

5. The portable imaging system according to claim 1, wherein the projector is a laser projector.

6. A method of laying out an architectural plan image on a worksite surface,
   emitting, via a Light Detection and Ranging (LIDAR) device, a LIDAR beam that scans a worksite to generate LIDAR data that is associated with a distance between the LIDAR device and each point of the LIDAR beam positioned on the worksite, wherein the LIDAR data is associated with a current state of the worksite and is associated with a plurality of current structures and conditions positioned on the worksite that exist in the current state of the worksite when scanned by the LIDAR beam;
   generating a 3D point cloud image of the worksite based on the LIDAR data, wherein the 3D point cloud image depicts the current state of the worksite and the plurality of current structures and conditions on the worksite;
   determining an orientation in rotation around an X-axis, Y-axis, and Z-axis position on the X-axis, Y-axis, and Z-axis of a projector relative to a coordinate system associated with the LIDAR device and a horizontal field of view and vertical field of view of the projector based on the projector projecting downward and defining a northern edge of a projected image;
   generating a first unit vector, a second unit vector, a third unit vector, and a fourth unit vector based on the horizontal field of view and the vertical field of view of the projector to generate corresponding depth edges of a geometric representation of the projected image, wherein the first unit vector, the second unit vector, the third unit vector, and the fourth unit vector intersect on a floor of the worksite;
   rotating the first unit vector, the second unit vector, the third unit vector, and the fourth unit vector based on the orientation of the projector projecting downward and defining the northern edge of the projected image;
   determining each projection corner of the projected image based on an intersection of the first unit vector, the second unit vector, the third unit vector, and the fourth unit vector with the floor of the worksite;

aligning the architectural plan image with the 3D point cloud image, wherein the architectural plan image is aligned with the 3D point cloud image so that each current structure and condition of the current state of the worksite as depicted by the 3D point cloud image is aligned with the architectural plan image when the 3D point cloud image is overlaid on the architectural plan image;

correcting an overlay of the 3D point cloud image on the architectural plan image to account for distortion between the 3D point cloud image and the architectural plan image when overlaid, wherein the architectural plan image is aligned on an overlapping range of an axis of the 3D point cloud image to correct the overlay of the 3D point cloud image on the architectural plan image;

generating the projected image that is projected onto the worksite surface, wherein the projected image is the architectural plan image that is aligned with the 3D point cloud image and corrects the distortion between the 3D point cloud image and the architectural plan image; and projecting, by the projector, the projected image onto the worksite surface that aligns the architectural plan image with the 3D point cloud image and corrects distortion between the 3D point cloud image and the architectural plan image with a projector thereby enabling the worksite to be modified based on the projected image;

adjusting the projected image projected onto the worksite surface by adjusting a brightness characteristic, a clarity characteristic, and a sharpness characteristic of the projected image to adjust the projected image to a plurality of actual conditions of the worksite surface, wherein the adjusting is executed by a user a via a wireless computing device.

7. The method of claim 6, wherein aligning the architectural plan image with the worksite image comprises adjusting the architectural plan image to fit within the worksite image.

8. The method of claim 6, and further comprising the step of locking the adjusted and aligned architectural image in place on the worksite surface.

* * * * *